METHOD FOR MAKING A PLURAL LAYERED PRINTED CIRCUIT BOARD

Original Filed May 31, 1962 3 Sheets-Sheet 1

INVENTOR.
FREDERICK H. SMITH, JR.
BY Anthony D. Cennamo
Daniel Rubin
ATTORNEY

Nov. 29, 1966 F. H. SMITH, JR 3,288,639

METHOD FOR MAKING A PLURAL LAYERED PRINTED CIRCUIT BOARD

Original Filed May 31, 1962 5 Sheets-Sheet 2

INVENTOR.
FREDERICK H. SMITH, JR.
BY
ATTORNEY

INVENTOR.

FREDERICK H. SMITH, JR.

BY

ATTORNEY

United States Patent Office 3,288,639

Patented Nov. 29, 1966

3,288,639

METHOD FOR MAKING A PLURAL LAYERED PRINTED CIRCUIT BOARD

Frederick H. Smith, Jr., Poughkeepsie, N.Y., assignor to Xerox Corporation, Rochester, N.Y., a corporation of New York

Original application May 31, 1962, Ser. No. 199,193, now Patent No. 3,207,127, dated Sept. 21, 1965. Divided and this application Dec. 4, 1964, Ser. No. 416,033
5 Claims. (Cl. 117—213)

Figure 1A:
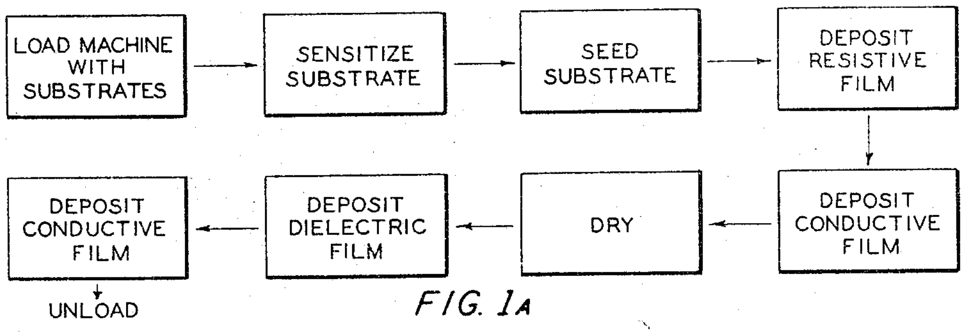

This application is a division of application Serial No. 199,193, filed May 31, 1962.

This invention relates to process and apparatus for the formation of printed circuit master boards on which printed circuits are to be formed. More specifically, the invention relates to automatic apparatus for the mass production of master boards by the successive deposition of electrical layers onto a suitable substrate.

In recent years, a technical revolution has been occurring in electronics wherein, in keeping with the growing complexity of electronic circuitry, techniques have been developed so that the fabrication of electronic circuit assemblies increasingly has been automated whereby the laborious hand assembly previously required has been substantially reduced. One technique which has contributed to this recent advance is the development of printed circuits wherein printed conductors or the like on a dielectric substrate connects the various passive circuit elements thereby eliminating the necessity of individual soldered wire connections.

With the growing change from tube circuits to transistor circuits, a new technique known as microminiaturization has led to the development of a module system of forming electric assemblies. In this system, a flat wafered plate or substrate of approximately one inch times one inch is processed to form the resistors, condensers and conductive lines, while the three dimensional components, generally as packaged elements such as transistors and diodes, are inserted to form the completed circuit. The thin film circuit elements, that is, the resistors, condensers and conductive lines that are formed on the wafer itself, are essentially two-dimensional circuit components. Thus, such circuits are generally termed "two-dimensional" or "2D" circuits.

One known method of forming 2D printed circuits is to employ a master panel comprising a laminated wafer formed by applying to a substrate plate or base of the dielectric material a plurality of separate layers of different electrical properties. Each laminae surface when exposed is selectively coated in the desired circuit areas with a protective material, commonly called "resist," so that these areas are covered. The unprotected area of the layer is then completely removed in a chemical etching bath after which the resist may be removed to expose the circuit element. Etching of a top layer leaves portions exposed of the layer immediately below and the process is then repeated sequentially with the different laminae of the wafer to form different electrical components in circuit relation to each other.

In the module technique of circuit miniaturization, a wafer of uniform size is selected as, for example, a dielectric substrate one inch by one inch or whatever size is deemed suitable. Substrate circuit components are then assembled and/or formed on the wafer. Complete circuits are then formed by combining the standard circuit components on their individual wafers by assembling the wafers, for example, in parallel spaced planes held fixed as by means of circuited rigid end plates to which may be connected three-dimensional elements, thus forming a module.

Formation of laminated wafers suitable for producing circuits by sequential application of resist and chemical etching requires the application of successively bonded layers of different electrical properties. In accordance with the prior art, the conventional processes for applying these layers was either by techniques of vacuum evaporation or electron bombardment being so limited because of difficulty experienced in applying dielectric layers to ceramic substrates or the like. While these prior techniques have been largely suitable, they suffer the disadvantage of being generally slow, relatively expensive and structurally inferior as compared to wafers produced in accordance with the instant invention. For example, approximately one hour is required to pump-down and deposit a first layer by vacuum evaporation techniques and one to six hours is required for depositing four successive layers. At the same time, at least as many crucibles are required as layers to be deposited thus incurring a capacity limitation of a vacuum system imposed by its physical size. Furthermore, as should be appreciated, successive application of layers with one vacuum pump-down requires the laborious task of masking the unused crucibles in preventing untimely evaporation of their contents. Otherwise, breaking of vacuum is required. Further, both vacuum evaporation and electron bombardment techniques require temperatures on the order of 2300° C. for the application of the usual dielectric and other layers because of the high temperatures at which these materials evaporate. Magnesium oxide, for example, evaporates at upwards of 3000° C. Similarly, chromium evaporates at about 2500° C. while nickel evaporates at about 3000° C. Thus, the capital investment for equipment for either of these prior methods is high while the processes themselves are relatively inefficient and difficult to apply.

Now in accordance with the instant invention, a method is provided whereby succssive layers, of different electrical properties, can be deposited on wafer boards on a mass production basis by utilizing novel techniques of chemical deposition. By contrast with the prior art methods, the instant invention utilizes maximum temperatures of approximately 60° C. while mass producing master boards in batches from substrate blanks in approximately a half hour or less. This not only offers the advantage of reduced capital investment over the techniques of the prior art, but at the same time, offers the advantages of a wider material choice, reduced production cost accorded by the benefit of mass production techniques and at the same time, there is produced a structurally superior product as will be understood. Thus many materials, which were known to have superior or more desirable properties for use in printed circuits, were previously too impractical because of evaporation characteristics, etc., but can now be simply applied. By the same token, relatively undesirable materials easily evaporated but having poor etching properties can now be eliminated. In addition, active components, such as diodes, are mounted to the boards via holes which should preferably be conductviely lined. Vacuum evaporation does not plate holes as does the method of the instant invention.

It is, therefore, an object of the invention to provide a novel process for depositing successive electrical layers onto a substrate for forming master boards on which printed circuits are to be produced.

It is a further object of the invention to provide novel modules for printed circuit master boards of successive layers through a sequence of chemical depositions.

It is a still further object of the invention to provide a novel module make up of successive electrically different layers on a substrate material by chemical deposition techniques.

It is a still further object of the invention to form improved master boards on which to produce printed circuits having successively deposited layers at substantially lower cost than techniques of the prior art.

These and other objects of the invention are attained by the process of the invention in which a plurality of wafer substrates are advanced sequentially through a series of chemical solutions, each solution of which separately prepares or deposits a uniform layer of predetermined electrical property. After applying all the layers, the master board is completed and is suitable for subsequent utilization in forming a printed circuit thereon.

Figure 1B:
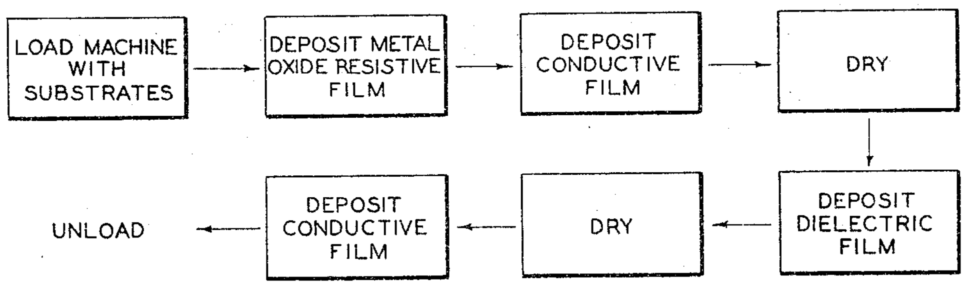
Figure 4:
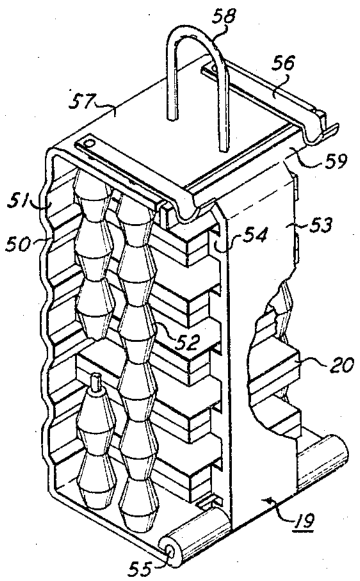
Figure 2:
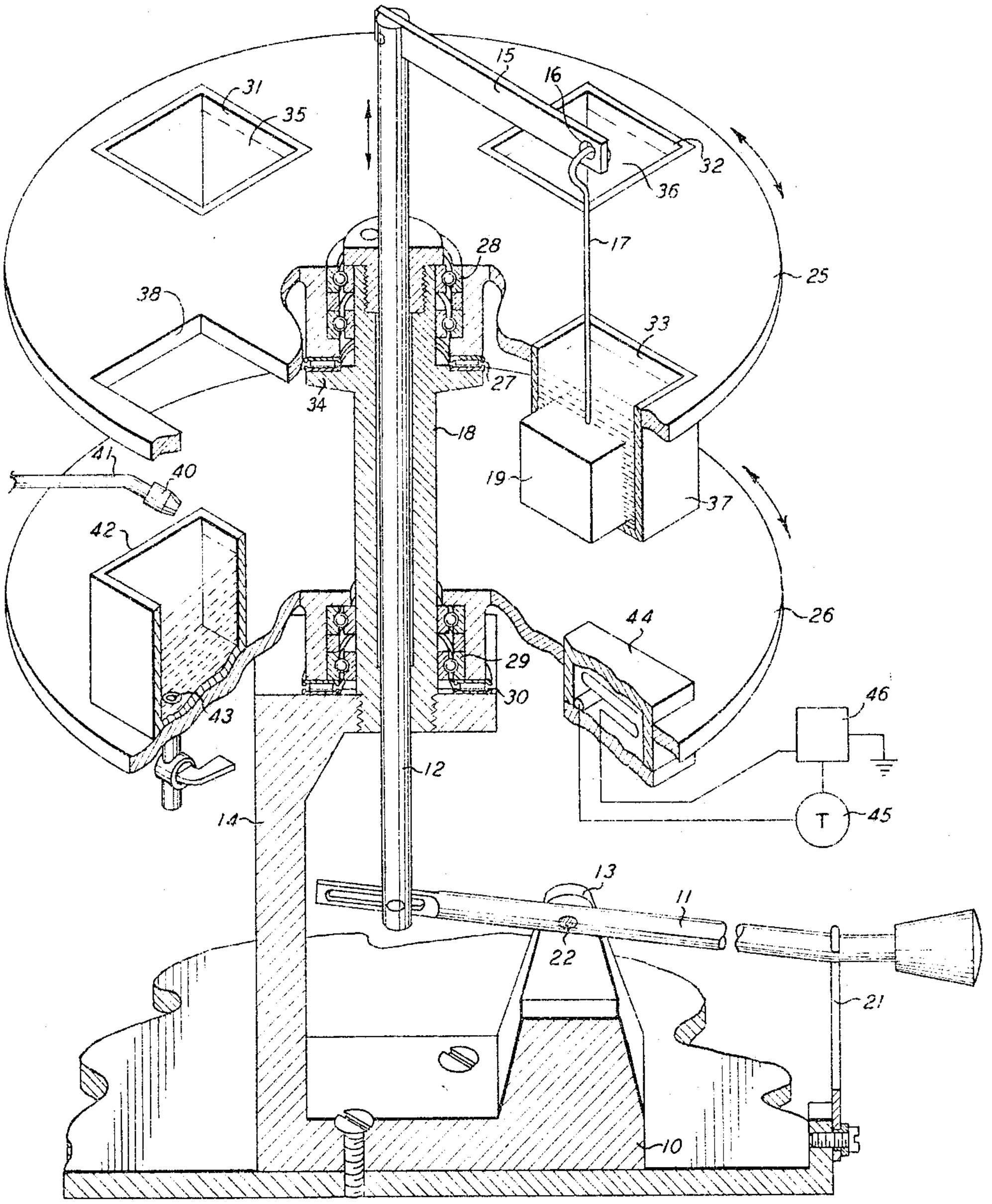
Figure 3:
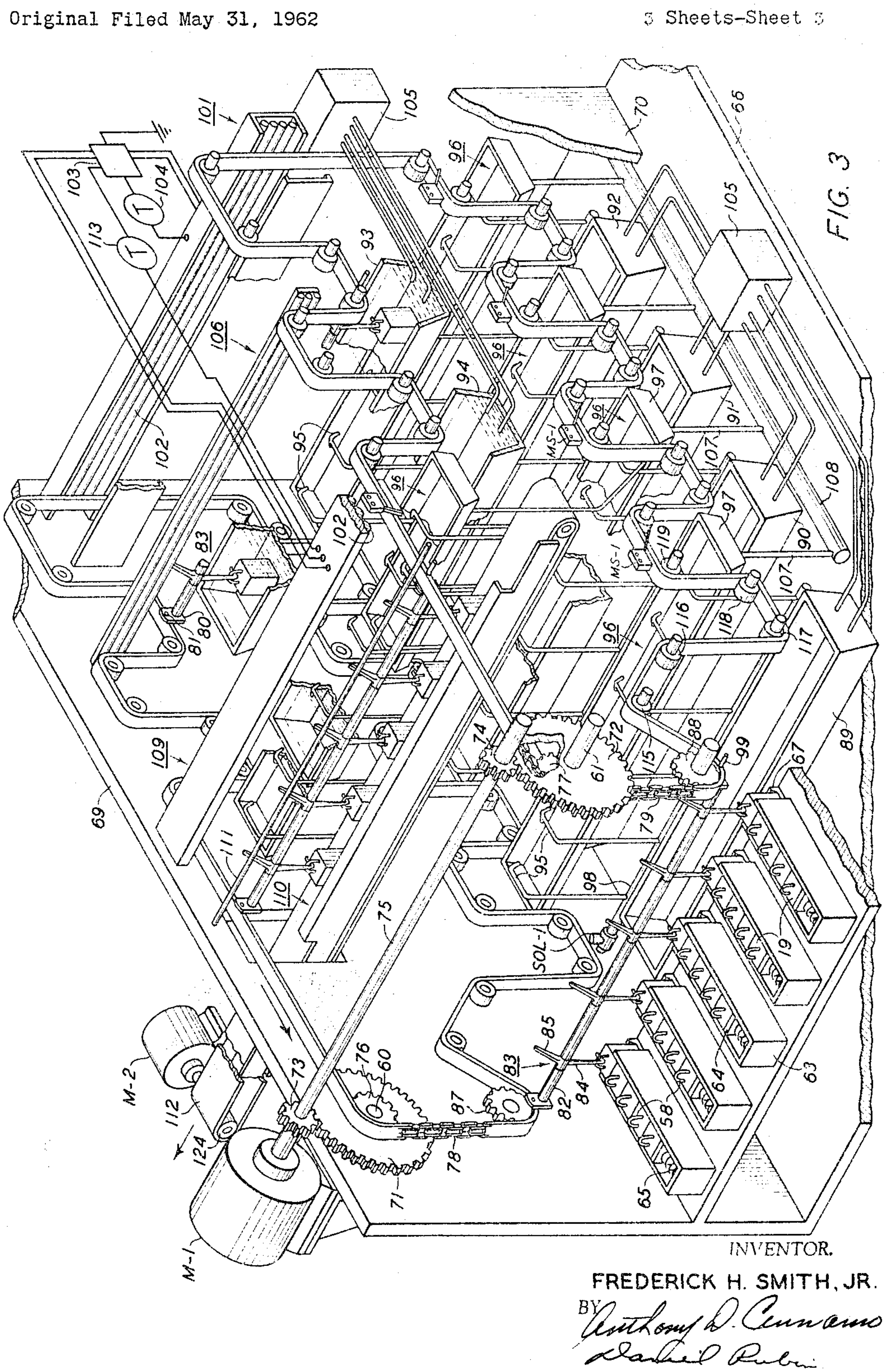

The invention will be more clearly understood from the following description when read in conjunction with the accompanying drawings in which:

FIGS. 1A and 1B are flow diagram embodiments of the process of the invention;

FIG. 2 isometrically illustrates semi-automatic apparatus in accordance with the invention;

FIG. 3 isometrically illustrates a fully automatic apparatus in accordance with the invention; and, FIG. 4 is an enlarged isometric of a cartridge for holding wafer plates to be processed.

Referring now to the drawings a wafer substrate may be processed, as for example, as shown in either FIGS. 1A or 1B. The substrate preferably is a planar member of high dielectric properties and of high mechanical strength as, for example, of a phenol-formaldehyde laminate, ceramic material, or the like, and which may be shaped or specially formed to include tabs, holes, slots or the like adapted for use in its ultimate assembly. As indicated in both processes of FIGS. 1A and 1B the successive layers are applied in the order of a resistive film, a conductive film, a dielectric film and then a conductive film with the FIGS. 1A and 1B differing chemically in their processing technique.

In accordance with FIG. 1A, the substrate is first dipped in a sensitizing solution such as tin chloride or the like, and then rinsed after which it is immersed in a seeding solution of a noble metal salt such as palladium or gold chloride and then rinsed. Thereafter, the resistive film is applied by immersing the substrate in a solution of a metal, such as chromium, which solution contains the metal plus a reducing agent capable of reducing the metal salts to the metal ions. After rinsing, a conductive film such as copper, nickel or the like is deposited thereon as from a prepared solution of copper sulphate or nickel chloride, respectively, and the substrate subsequently rinsed and dried. To apply the dielectric layer, the substrate is then immersed in an alcoholic solution of a metal and as the substrate is withdrawn, it is heated to convert the alcoholate to a metal oxide with dielectric properties as, for example, magnesium oxide or barium titanate. Multiple dippings may be required to ensure an absence of pin holes in any particular layer. The final layer of a conductive film, such as copper or nickel, is then applied over the previously applied dielectric. After the plate is rinsed and dried, an RC circuit master plate is conditioned for circuit processing as aforesaid.

In accordance with the flow diagram of FIG. 1B, a resistive film is first formed by immersing the substrate in an alcoholic solution of a metal such as tin and, on removal, it is heated to convert to the metal oxide which has the properties of a resistive film. Thereafter, the successive layers may be applied similarly as described above in connection with FIG. 1A.

Referring now to FIG. 2, there is disclosed a semi-automatic apparatus for carrying out the process above described.

As can be seen, the apparatus includes a base 10 on which to support the various components. There is included a pivot handle 11 connected to a reciprocally movable shaft 12 supported for vertical movement in a bushing 18 threaded to a C-shaped support 14. The handle is effectively a double ended lever adapted to pivot via pivot 22 about a fulcrum 13 such that on depressing the free-end of the handle, shaft 12 is raised against the inherent weight of the shaft and the weight supported thereon. Extending perpendicularly from the upper end of the shaft is an arm bracket 15 having a hole 16 to receive a hook 17 from which is suspended a cartridge 19, to be described, and containing a plurality of substrates 20 to be processed. A swing hook-latch 21 is adapted to secure the handle in a position whereby the cartridge 19 is freely suspended in solution of a selected reservoir.

Supported for rotation independently about shaft 12 as an axis are two circular plates or shelves 25 and 26. The upper shelf 25 is mounted on a slideway 27 in turn resting on the horizontal annular flange 34 of bushing 18 and is supported for rotation on the outer race of a pair of ball-bearings 28 mounted on the bushing. The lower shelf 26 is similarly supported for rotation on a pair of bearings 29 and resting on a slideway 30 supported on base 14.

Shelf 25 contains a plurality of openings 31, 32 and 33 from which are suspended a plurality of reservoir tanks 35 through 37, respectively, each containing an appropriate chemical solution in accordance with the invention. An additional opening 38 permits related processing of the substrates on elements supported below shelf 25 on or about shelf 26 including a water nozzle 40 connected through a hose 41 to a pressurized water supply whereby substrates may be rinsed at the appropriate part of the cycle. Below the water nozzle is a basin 42 having a drain 43 to collect runoff water from the substrates during rinsing. Also supported on shelf 26 is a heater 44 under control of a thermostat 45 and connected to a source of potential 46 whereby heat can be applied to hydrolize alcoholates as aforesaid.

The apparatus is operative by raising and lowering the suspended substrates sequentially into the various chemical solutions as described in connection with FIGS. 1A and 1B. By depressing the free end of handle 11, the substrates are raised above shelf 25 and the shelf is free to be indexed until a desired solution in its reservoir is below the substrates to receive them as the shaft is lowered. On withdrawal after immersion, the shelf 25 may be indexed to opening 38 and the substrates dropped therethrough into operative relation with either nozzle 40 or heater 44, as required.

Referring now to FIGS. 3 and 4, a fully automatic apparatus in accordance with the invention is illustrated. In this embodiment, the substrates 20 to be processed are preloaded into cartridges 19 in a manner whereby one surface of each substrate will be freely exposed in a chemical solution in which it is immersed. In a preferred manner of the invention, two substrates are arranged back-to-back with their contiguous edges masked, or alternatively, the substrates may be supported individually separated with one surface of each previously masked. Where desired to form two-sided master boards with circuits on each side, the substrates can be independently supported with both sides exposed.

The cartridge is a box-like member having a ridged side plate 50 adapted to receive substrates in pairs in a recessed portion 51. In this manner, the bottom and top of the substrates are exposed while the edges are further shielded by truncated rollers 52 adapted to guide the substrates into position. The opposite side wall 53 contains a series of raised ridges 54 that bear against the edges of the substrates to maintain them in alignment.

Wall 53 of the cartridge is pivotally mounted about pivot 55 whereby it may be pivoted outwardly for convenience of loading and unloading substrates. A pair of spring latches 56 that latch bar 59 of the side wall maintain the side wall closed while the substrates are being processed. With the side wall open, substrates may be inserted in pairs over rollers 52 into recess 51 properly aligned and held until wall 53 is reclosed after the cartridge is fully loaded. Extending from front plate 57 is an eyehook 58 by which the cartridges are supported in the apparatus of FIG. 3 as will be understood.

Referring now more particularly to FIG. 3, the individual cartridges are pre-stacked in a plurality of adjacent horizontal magazines 63 in which the cartridges are urged forward against a stop 67 to a loading position by a spring-loaded follower plate 64 actuated by a spring 65.

The processing apparatus is comprised of a pair of parallel spaced side castings 69 and 70 bolted onto a suitable console base 66. Mounted for rotation in the opposite castings is a pair of shafts 60 and 61 to which are secured drive gears 71 and 72, respectively, which are driven from motor M–1 via pinions 73 and 74, respectively, secured on motor shaft extension 75. Secured also to the shafts are chain sprockets 76 and 77 which are effective in their rotation to continually advance chains 78 and 79, respectively, in unison.

Pivotally mounted and oppositely aligned on the chains is a plurality of brackets 80 pivoted via a pin 81 mounted on the side of the chains and between which is supported a laterally extending rod 82, of approximately ⅜ inch stock. The rods include a plurality of individual uniformly spaced recesses (not shown) to receive hook brackets, generally designated 83, suspended to swing freely about the rod and parallel to the direction of chain movement.

Each bracket 83 includes a bottom section terminating in a hook 84 and a top tail section 85. As the rods advance with the chains, the hooks approach the position of magazines 63 whereat they are directed via guide sprockets 87 and 88 to a position relatively behind the forwardmost cartridge in the magazine until each hook 84 latches under an eye 58. On further advancement, the hooks remove the forwardmost cartridge from their respective magazines by withdrawing the cartridge past stops 67. Thereafter, each cartridge is supported suspended from their individual hooks and by means of the moving chains, continue to be advanced over suitable idler and guide sprockets, such as guide sprockets 115, 116, 117, 118 and 119 sequentially through the various stations of treatment that provides the chemical deposition of the various successive layers.

The chemical solutions are contained in individual reservoir tanks arranged in the path of cartridge movement. In the embodiment illustrated, the apparatus is adapted to deposit the successive layers in accordance with the process of flow diagram 1A. Accordingly, reservoirs 89 through 94 respectively, contain solutions for sensitizing, seeding, resistive layer deposit, conductive layer deposit, dielectric layer deposit, and conductive layer deposit each of which are described in examples below.

Layer thickness for the different layers has been found largely to vary as a function of immersion time, solution viscosity and rate of withdrawal from the solution. The dimensions of each reservoir in the direction of chain movement is therefore selected to compensate for adequate immersion time of the cartridges in the different stages of process as a function of chain speed. Also, the chains may be operated intermittently to ensure the required immersion time. For obvious reasons, each reservoir should be of a material not subject to attack by the chemical solution it is to contain.

Along the path of travel following each reservoir, excepting 93, the substrates are rinsed at a rinsing station, each designated 96, with tap water from a spray nozzle 95 connected separately via individual water headers 98 in turn connected to a source of pressurized tap water through a plurality of individual solenoids SOL–1. Each solenoid is energized by the action of a pin 99 associated with each rod 75 which actuates a microswitch MS–1 in passing over the particular rinse station. Each rinse station also includes a drip pan 97 having a suitable drain 107 connected to a drain header 108 for disposing of the rinse water runoff to a sump or the like.

After rinsing, following the conductive film dips in reservoirs 92 and 94, the substrates are dried in ovens 101 and 109, respectively, that are heated by a plurality of spaced radiant coils 102 energized from a power supply 103 under control of thermostats 104 and 113, respectively. Alternatively, other forms of heating can be employed including warm air jets prearranged to project a warm stream of air across the substrates.

Following the dielectric dip in reservoir 93, a heater 106 is provided to heat the film of solution on the substrate and convert the alcoholate to a metal oxide as aforesaid. The heater may be similar to the heaters described above.

Each of the chemical solutions are individually maintained at a controlled consistency of concentration and temperature by means of a titration unit 105, which may be of a type marketed by Technicon Controls, Inc. of Chauncey, New York, under the tradename "Auto Analyzer."

After completely depositing all successive layers, the cartridges are discharged at discharge station 110 at which a stationary rod 111 intercepts the tail 85 of hook 83 causing it to swing rearwardly and drop the individual cartridges onto continuously moving conveyor 112 which then conveys the cartridges to a suitable discharge point at which the wafer boards can be removed from the cartridges. Operation of the conveyor is effected from a motor M–2 connected directly to the axle of the conveyor drive roll 124.

The following examples illustrate the chemical processes of the invention:

*Example 1*

A suitably bonded resistive layer of about 100 to 1000 angstroms thickness was found to deposit onto a dielectric ceramic substrate by immersing the substrate in a one percent solution of tin methylate for approximately five to ten seconds. On withdrawal of the substrate from solution, heat was applied to a temperature of approximately 60° C. to convert the alcoholate to a tin oxide having resistive properties.

*Example 2*

Chromium was used to form a resistive layer after initially preparing a dielectric ceramic substrate by immersing it in a sensitizing solution of tin chloride, followed by a water rinsing and immersion in a seeding solution of a noble metal salt of palladium chloride and then rinsing again. A layer of chromium was then deposited in accordance with the electroless process disclosed in Eisenberg Patent U.S. 2,829,059.

*Example 3*

A conductive layer of copper of between 1000 and 2000 angstroms was deposited after seeding and sensitizing as in Example 2 onto an immersed substrate having a previously applied resistive layer of tin oxide from a solution prepared in accordance with the following proportions: 4 grams of copper sulfate; 15 grams of Rochelle salts; and 9 grams of sodium hydroxide all dissolved in 1,000 ml. of distilled water and mixed in solution with 200 ml. of formaldehyde.

*Example 4*

A conductive layer of copper of between 1000 and 2000 angstroms was applied over a previously applied resistive layer of chromium utilizing the same procedure and solution described in Example 3.

*Example 5*

Nickel of between 1000 and 2000 angstroms deposited after seeding and sensitizing as in Example 2 onto an immersed substrate having a previously applied resistive layer of tin oxide from a solution prepared in accordance with the following proportions: 10.7 oz./gal. of 80 oz./gal. nickel chloride solution; 1.33 oz./gal. of sodium hypophosphite; and 1.33 oz./gal. of sodium citrate, the solution being maintained approximately between 68° to 81° at a pH factor of approximately 4.

*Example 6*

Nickel of between 1000 and 2000 angstroms was applied over a previously applied resistive layer of chromium utilizing the same procedure and solution described in Example 5.

*Example 7*

Nickel of between 1000 and 2000 angstroms deposited after seeding and sensitizing as in Example 2 onto an immersed substrate having a previously applied resistive layer of tin oxide from a solution prepared in accordance with the following proportions: 4 oz./gal. of 80 oz./gal. nickel chloride solution; 1.7 oz./gal. of ammonium hydroxide; 1.0 oz./gal. sodium hypophosphite; 6.5 oz./gal. of ammonium chloride, and 9.5 oz./gal. sodium citrate, the temperature of the solution being maintained at approximately 68° to 82° C. in a pH of approximately 8 to 10.

*Example 8*

Nickel of between 1000 and 2000 angstroms was applied over a previously applied resistive layer of chromium utilizing the same procedure and solution described in Example 7.

*Example 9*

A dielectric layer of approximately 8,000 angstroms was found to be suitably formed on a previously applied metallic layer from a solution formed by dissolving magnesium in absolute methanol to form a one percent solution of magnesium methylate. After five to ten seconds of immersion, the substrate was removed and the film of solution thereon hydrolyzed by applying heat at a temperature of about 60° C. whereby to form a magnesium oxide film having dielectric properties.

*Example 10*

A conductive layer of copper of about 1000 to 2000 angstroms was deposited in about eight to ten minutes onto an immersed substrate having a previously applied dielectric layer of silicon monoxide, by first sensitizing and seeding the layer (one–two minutes each as in Example 2), from a solution prepared in accordance with the following proportions: four grams of copper sulfate, 15 grams of Rochelle salts and nine grams of sodium hydroxide all disolved in 1,000 ml. of distilled water and mixed in solution with 200 ml. of formaldehyde.

Each of the above examples is typical of operations that can be combined for adding successive layers onto substrate boards on which printed circuits are to be formed. It is not intended, however, that the invention be limited by the method and compositions of the examples, nor to the order of succession in which the layers are applied in the manner of the examples or as hereinbefore described. Obviously, each layer could be formed from other compositions known to those skilled in the art, in a variety of successive orders. Thus although ceramic has been frequently mentioned for the substrate, other suitable substrates would include plastics and reinforced plastics commonly used for printed circuit boards such as grades XXXP and G–10. Consideration in the selection of the various layers must be given to the solutions in which the layers are to be etched in forming the circuit components. Preferably, adjacent layers should not be attacked by the same etching solution. Also any or all layers may require one or more dippings in solution to obtain a desired thickness and uniformity. When hydrolyzing an alcoholate, care must be exercised to avoid the presence of excessive moisture that could cause the formation of the hydroxide rather than the metal oxide.

The time required to completely process the substrates will, of course, vary with the number and materials of layers to be applied. Sensitizing and seeding steps are generally required prior to depositing a conductive film, unless an alcoholate step is used, as well as for depositing resistive films such as chromium. It has been found that to carry out the process in accordance with FIG. 1A, approximately 25 to 30 minutes is required while FIG. 1B can be performed without sensitizing and seeding in about 20 minutes.

A glass substrate previously coated with a thin layer of tin oxide is marketed by the Pittsburgh Plate Glass Company under the tradename of NESA and can be utilized in the invention.

Therefore, in accordance with the invention, there is described novel method and apparatus for forming master boards on which to produce printed circuitry by chemical deposition techniques. The process lends itself to forming layers on flat surfaces, curved surfaces, irregular surfaces or the like on which prior art methods as vacuum evaporation are unsuitable. The results of this method and apparatus have been shown to produce superior master boards on a mass production basis at substantial reductions of cost.

Since many changes could be made in the above construction and many apparently widely different embodiments of this invention could be made without departing from the scope thereof, it is intended that all matter contained in the drawings and specification shall be interpreted as illustrative and not in a limiting sense.

What is claimed is:

1. The method of making a laminated plate for use in forming printed circuits comprising the sequential steps of:

(a) immersing a dielectric base plate for a predetermined time period of approximately five to ten seconds in a solution of tin alcoholate which deposits thereon;

(b) heating the deposit on said plate to approximately 60° C. in the presence of oxygen so as to form an electrically resistive layer of tin oxide thereon;

(c) sensitizing and seeding the tin oxide surface of said plate; and (d) immersing said plate in another solution for a predetermined time period to chemically and electrolessly deposit an electrically conductive layer selected from the group consisting of copper and nickel overlying said tin oxide layer.

2. The method of claim 1 in which said dielectric has a ceramic surface on which said additional layers are deposited.

3. The method according to claim 1 including the added steps to chemically and electrolessly sequentially form a dielectric layer and a second electrically conductive layer in overlying contact with said first recited conductive layer.

4. The method of making a laminated plate for use in forming printed circuits comprising the sequential steps of:

(a) sensitizing and seeding the surface of a dielectric base plate;

(b) immersing said plate for a predetermined time period in a solution of chromium to deposit an electrically resistive layer of chromium thereon;

(c) repeating said sensitivity and seeding step; and (d) immersing said plate in a solution of proportions consisting essentially of 4 grams of copper sulphate, 15 grams of Rochelle salts, and 9 grams of sodium hydroxide, all dissolved in a 1,000 ml. of distilled water and mixed in solution with 200 ml. of formaldehyde to deposit an electrically conductive copper layer over said resistive layer.

5. The method according to claim 4 including the added steps to chemically and electrolessly sequentially form a dielectric layer and a second electrically conductive layer in overlying contact with said first recited conductive layer.

(References on following page)

References Cited by the Examiner

UNITED STATES PATENTS

| | | | |
|---|---|---|---|
| 2,567,331 | 9/1951 | Gaiser et al. | 117—211 |
| 2,702,253 | 2/1955 | Bergstrom | 117—130 X |
| 2,748,031 | 5/1956 | Kafig | 117—217 X |
| 2,759,854 | 8/1956 | Kilby | 117—217 |
| 2,796,364 | 6/1957 | Suchoff | 117—222 |
| 2,805,965 | 9/1957 | Robinson | 117—106 X |
| 2,829,059 | 4/1958 | Eisenberg | 117—130 X |
| 2,971,867 | 7/1961 | Lytle | 117—215 X |
| 3,011,920 | 12/1961 | Shipley | 117—213 |
| 3,105,772 | 10/1963 | Loiseleur | 117—35 |
| 3,134,690 | 3/1964 | Erickson | 117—47 X |
| 3,148,072 | 9/1964 | West | 117—130 |
| 3,162,512 | 12/1964 | Robinson | 117—217 X |
| 3,169,892 | 2/1965 | Lamelson | 117—217 X |
| 3,200,326 | 8/1965 | Pritikin et al. | 117—217 X |

ALFRED L. LEAVITT, *Primary Examiner.*

JOSEPH B. SPENCER, RICHARD D. NEVIUS, *Examiners.*

W. L. JARVIS, *Assistant Examiner.*